United States Patent
Borutta et al.

[11] Patent Number: 5,963,039
[45] Date of Patent: Oct. 5, 1999

[54] TESTING ATTACHMENT RELIABILITY OF DEVICES

[75] Inventors: Richard Borutta, Hopewell; John J. Burack, Toms River; Michael V. Occhipinti, Freehold; John C. Manock, Belle Mead, all of N.J.

[73] Assignee: Lucent Technologies Inc., Murray Hill, N.J.

[21] Appl. No.: 09/018,746

[22] Filed: Feb. 4, 1998

[51] Int. Cl.⁶ .................................................. G01R 31/02
[52] U.S. Cl. ......................... 324/537; 324/761; 73/815; 73/588
[58] Field of Search ................................ 324/691, 713, 324/718, 522, 523, 525, 537, 538, 760, 761; 73/570, 571, 582, 588, 812, 815, 816

[56] References Cited

U.S. PATENT DOCUMENTS

| | | | |
|---|---|---|---|
| 4,218,922 | 8/1980 | Ensminger | 73/588 |
| 4,287,766 | 9/1981 | Emsminger | 73/582 |
| 5,533,398 | 7/1996 | Sakurai | 73/815 |
| 5,744,975 | 4/1998 | Notohardjono et al. | 324/760 |
| 5,828,568 | 11/1998 | Dickinson et al. | 73/814 |
| 5,850,146 | 12/1998 | Shim et al. | 324/761 |

*Primary Examiner*—Diep N. Do

[57] ABSTRACT

An apparatus for testing the attachment reliability of a device mounted at least by an electrically conducting joint to a surface of a circuit board is provided. The apparatus includes an environmental chamber in which the board can be placed; an actuator for applying a force to the device; an electrical monitoring unit for monitoring any events at the electrically conducting joint; and a memory unit for storing an event profile that includes information related to the events. The apparatus may further include a processing unit for characterizing the quality of the electrically conducting joint based on the stored event profile and for performing various other functions. A method for testing the attachment reliability of the device is also provided.

53 Claims, 4 Drawing Sheets

5,963,039

TESTING ATTACHMENT RELIABILITY OF DEVICES

BACKGROUND OF THE INVENTION

This invention relates to techniques for testing electronic systems. More particularly, this invention relates to methods for testing the mechanical and electrical attachment reliability of devices mounted to printed circuit boards.

Semiconductor devices are usually mounted to printed circuit boards and operate at relatively high temperatures. However, these elevated temperatures can lead to premature aging and failure of the devices, the printed circuit boards, and any other devices mounted to those circuit boards, especially with the continuing trend toward higher power devices. In order to avoid such failures in the field, extensive environmental testing in the laboratory has become an integral part of the design cycle.

A variety of techniques have been used to test the attachment reliability of devices mounted to circuit boards. For example, data analyzers, which have been used to monitor board interconnects subject to cyclic environmental loading, are available from Analysis Tech, a company located in Wakefield, Mass. In particular, these data analyzers can measure certain parameters essential for the design and implementation of reliable electronics. Such parameters include junction temperature and thermal resistance, as well as transient thermal response and die attachment quality. Normally, these parameters are measured during or after thermal cycling of the board to simulate thermal wear and tear. One disadvantage of these analyzers, however, is that they do not measure the mechanical parameters that are also critical for the design of reliable electronics.

A primitive method of simulating accelerated mechanical wear and tear in order to measure these mechanical parameters involves gripping the corners of the circuit hoard and twisting, or flexing, the board. This method does not accurately simulate device wear and tear, though, because a device is not being pushed or pulled, such as when a cable hangs from a connector. Moreover, this method cannot apply a controlled force to a single device without disturbing other devices on the board. Furthermore, the twisting method requires bulky mechanical apparatus to twist the board. This bulk may prevent a large number of boards from being placed in an environmental chamber simultaneously.

It is therefore an object of the present invention to provide an apparatus capable of accurately simulating one or more devices being pushed or pulled.

It is another object of the present invention to provide an apparatus capable of applying a controlled force to a single device mounted on the board without physically disturbing any other devices.

It is yet another object of the present invention to provide an apparatus that is relatively compact so that numerous circuit boards can be tested at once in a single environmental chamber.

SUMMARY OF THE INVENTION

This and other objects of the invention are accomplished in accordance with the principles of the present invention by providing an apparatus for testing the attachment reliability of a device mounted at least by an electrically conducting joint, such as a solder or epoxy joint, to a surface of a circuit board. The apparatus includes: an environmental chamber (for varying various environmental conditions, such as temperature and humidity) in which at least one circuit board is placed, at least one actuator for applying a force to the device mounted to that board, an electrical monitoring unit for monitoring events that occur at the electrically conducting joint, and a memory unit for storing in an event profile information related to the events. A processing unit, such as a personal computer, for characterizing the quality of the electrically conducting joint based on the stored event profile may also be included.

A method for testing the electrical and mechanical reliability of a device is also provided. The method includes environmentally cycling the device and the electrically conducting joint, applying a force to the device, monitoring for an event at the electrically conducting joint, storing information related to the event in an event profile, and characterizing the quality of the joint based on the stored event profile.

Further features of the invention, its nature and various advantages, will be more apparent from the accompanying drawings and the following detailed description of the preferred embodiments.

DETAILED DESCRIPTION OF THE PREFERRED EMBODIMENTS

Figure 1:
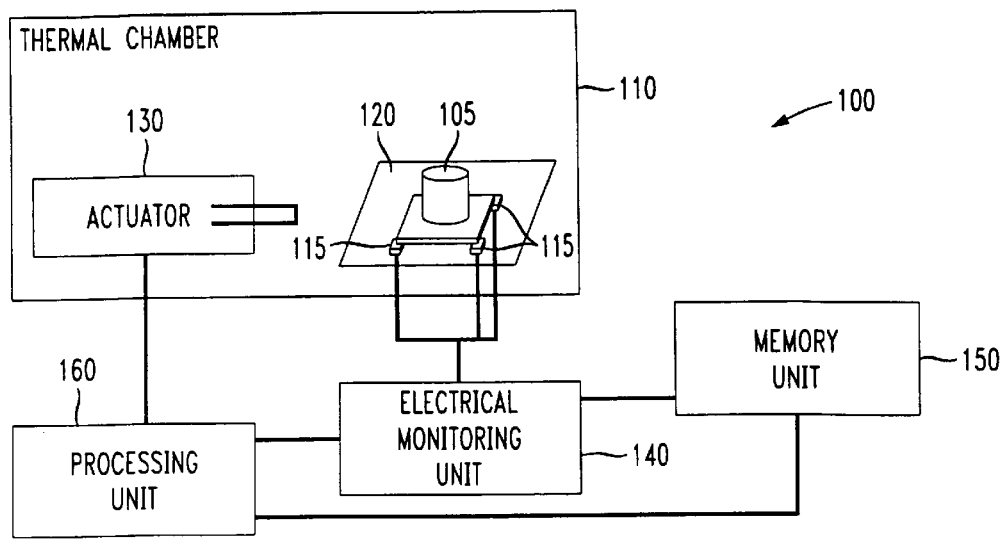
FIG. 1 is a schematic diagram of an apparatus for testing the attachment reliability of at least one device mounted to a circuit board in accordance with the present invention.

FIG. 1 shows a schematic block diagram of apparatus 100 for testing the attachment reliability of at least one device 105 mounted by electrically conducting joints 115 to a surface of circuit board 120. Apparatus 100 includes environmental chamber 110 in which board 120 is placed during testing, actuator 130 for applying a force to device 105, electrical monitoring unit 140 for monitoring any events at electrically conducting joints 115, and memory unit 150 for storing in an event profile information related to the events. Processing unit 160 for characterizing the quality of electrically conducting joints 115 based on the stored event profile may also be included.

Figure 2:
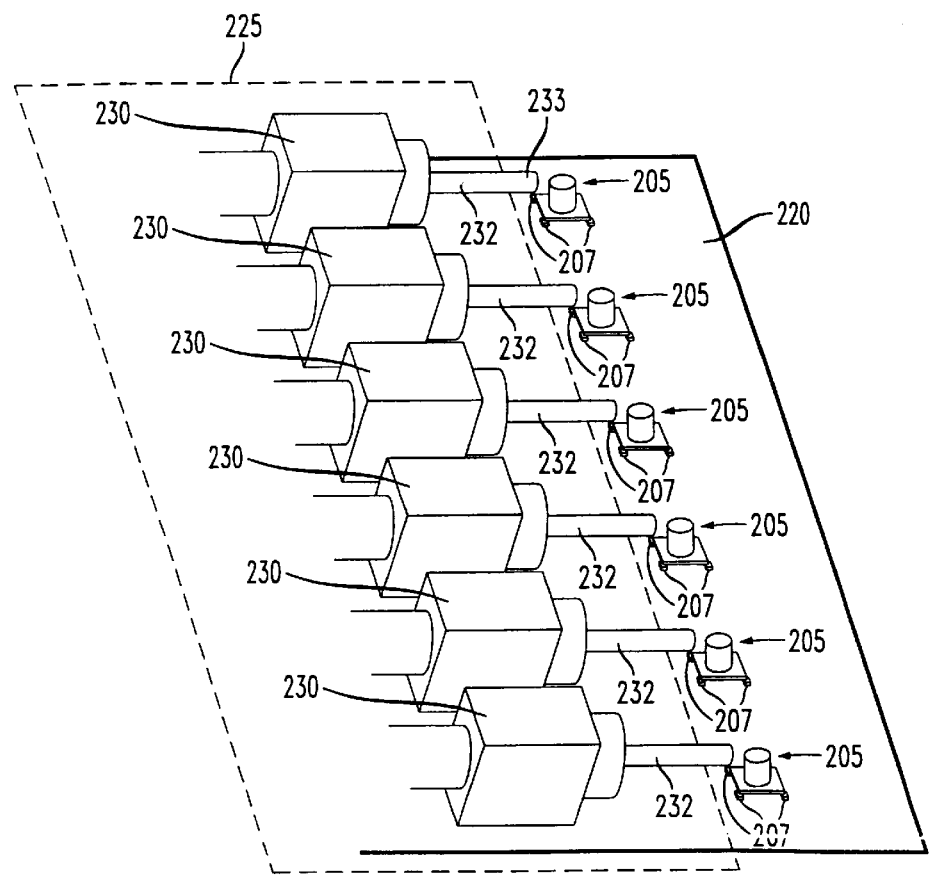
FIG. 2 is a perspective view of an array of actuators and devices mounted to a circuit board for testing in accordance with the present invention.

As shown in FIG. 2, each of devices 205 are preferably aligned with respective pistons 232. Devices 205 can be any type of device that can be mounted to board 220 by at least one electrically conducting joint 207. An example of a device that has been tested in accordance with this invention are sold under model No. 81 MMCX-50-0-1 by Huber+ Suhner, Inc., of Essex Junction, Ver.

FIG. 2 also shows actuator bank 225, which includes multiple actuators 230 mounted to a single circuit board 220.

As described more fully below, actuators may be mounted directly to board 220 or to a separate supporting frame to facilitate board exchange during multiple board testing. Pistons 232 are preferably hydraulically or pneumatically controlled, and therefore may share a common hydraulic or pneumatic supply line. One type of hydraulic actuator that may be used in accordance with this invention is sold under model No. 3BCS by Clippard Instrument Laboratory, Inc., of Cincinnati, Ohio. Actuators 230 should be able to operate over a wide temperature range provided by environmental chamber 110. A typical temperature range over which the actuator should be capable of operating is from about 0° C. to about 100° C. Accordingly, the actuator should be constructed of thermally resistant materials, such as stainless steel, for operation in this temperature range. Preferably, at least one actuator is aligned with each device so that a controlled force may be applied to any single device without necessarily applying a force to any other device on the board. This can be accomplished by mounting an individual actuator next to each actuator (as shown in FIG. 2) or by mounting a preassembled bank of actuators next to the devices.

Figure 3:
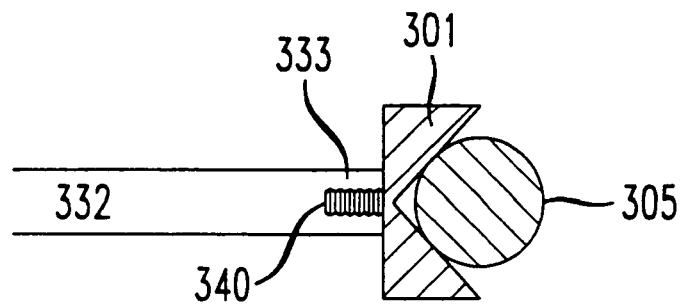
FIG. 3 is a planar view of a tip portion of an actuator suitable for pushing a device mounted to a circuit board in accordance with the present invention.
Figure 4:
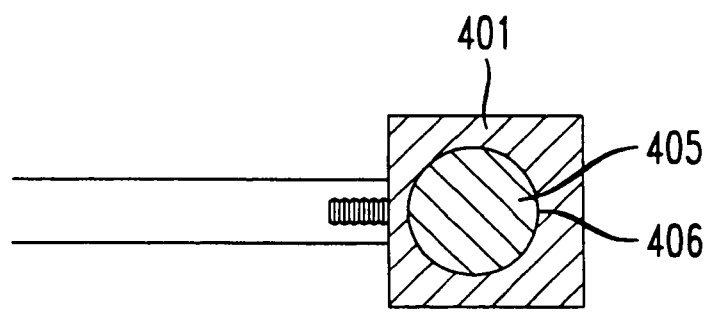
FIG. 4 is a planar view of a tip portion of an actuator suitable for pushing and pulling a device mounted to a circuit board in accordance with the present invention.

Each of actuators 230 must be capable of applying a force to its respective device, such as a pushing or pulling force. A pushing force may be applied to a portion of a device, such as to the device head, by simply butting distal end 233 of piston 232 against device 205, as shown in FIG. 2. Optionally, as shown in FIG. 3, a V-shaped tip portion 301 may be fastened to distal end 333 of piston 332 for improving the coupling between piston distal end 333 and device 305. Tip portion 301 may be attached to distal end 333 by any means, including screw 340. FIG. 4 shows another tip portion 401 that is adapted to receive a portion of device 405 by fitting over that portion, such as a connector head. In this case, tip portion 401 has a round bore 406 adapted to receive the cylindrical portion, or head, of device 405. By fitting over device 405, tip portion 401 can pull, as well as push, device 405. Because device 405 can be pushed and pulled, simulation of mechanical wear and tear of the device is more accurate. Because the simulation is more accurate, the attachment reliability analysis can also be made more accurately.

As explained above, the pneumatic or hydraulic actuator applies a force to the device. The magnitude, direction, and time dependence of that force may be varied as desired, and controlled by a processing unit, such as unit 160 shown in FIG. 1. Processing unit 160 may be programmed to instruct actuator 130 to apply a force to device 105 in a synchronized fashion with environmental conditions provided by environmental chamber 110. One type of synchronization may involve applying a predetermined force before, after, or during a thermal cycle provided by environmental chamber 110. The magnitude of the force may be controlled to increase slowly or quickly until a maximum force is achieved. Then, the force may be controlled to decrease at the same or different rate. An applied force may also simulate a "rocking" motion, that is, it may repeatedly push and pull on a device, perhaps for simulating the vibratory motion of an attached cable.

In addition to applying a force with a variable magnitude, the force may be applied to the device in any direction. For example, the force may be applied in a direction parallel (as shown in FIG. 2) or perpendicular (not shown) to the surface of board 120. Also, when multiple actuators are used for a single device (not shown), a combination of forces having different magnitudes and directions could be applied simultaneously or sequentially.

Figure 5:
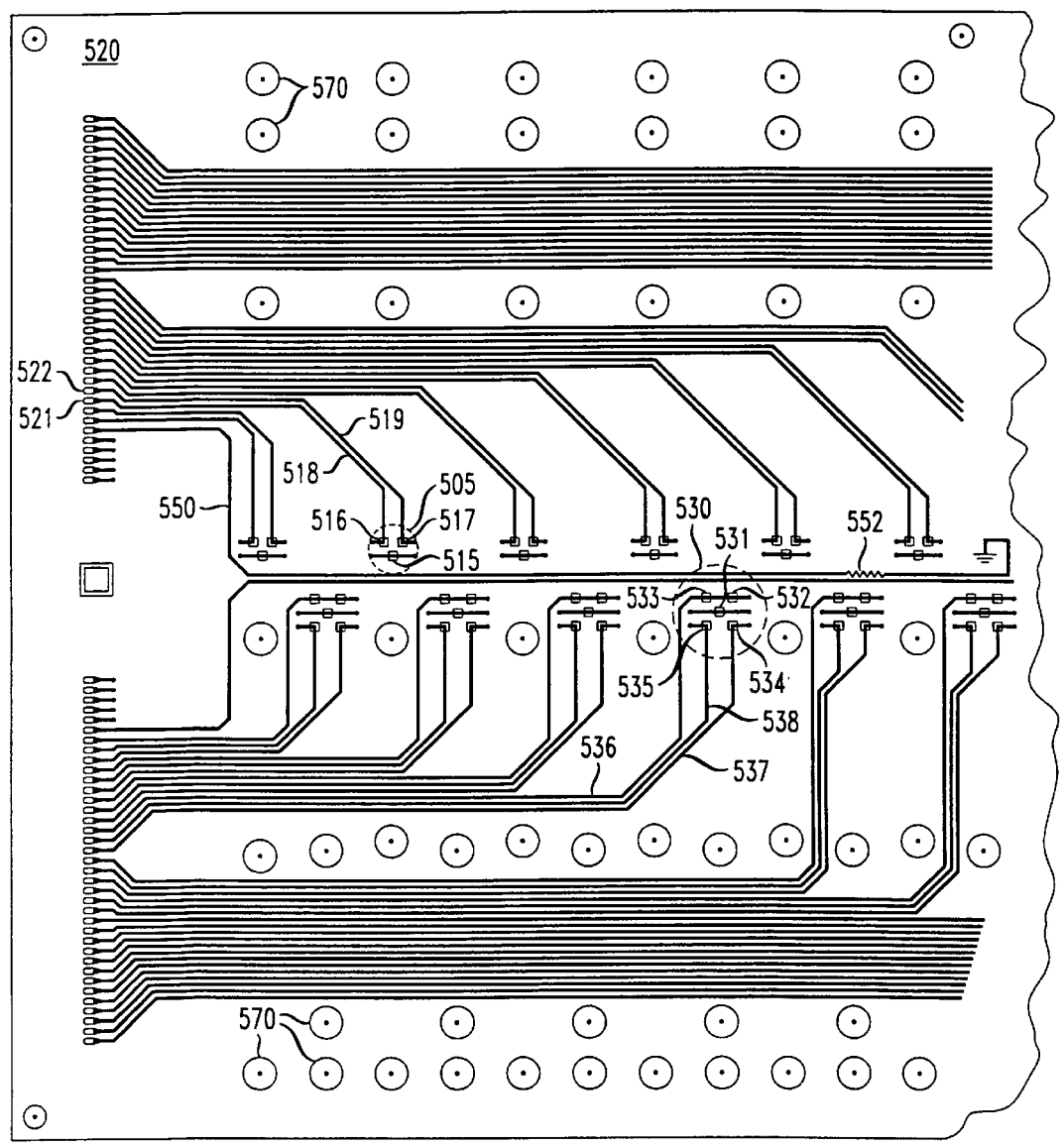
FIG. 5 is a planar view of one illustrative embodiment of a printed circuit board showing the electrical connections of three and four pad electrical devices in accordance with the present invention.

Actuators 230 may be mounted directly to board 220 adjacent their respective devices 205 or mounted to a separate frame (not shown). When actuators 230 are mounted directly to board 220, they may be mounted to the board via mounting holes 570, as shown in FIG. 5. If two or more boards are tested, the same actuators may be used to test each board by simply exchanging the boards in the chamber. This exchange is facilitated when the mounting holes on both boards are arranged similarly, so that the actuators may be mounted to the same respective holes on both boards. However, when the actuators are mounted directly to the board (e.g., via mounting holes 570), each actuator must be unmounted and remounted during board exchange. Accordingly, in order to further facilitate board exchange, frame-mounted actuators may be preferable (because only electrical, not hydraulic, connections would be required).

Electrical monitoring unit 140 includes any electrical monitoring equipment necessary to detect events at the electrically conducting joints. As used herein, an event may be any substantial change in an electrical, mechanical, or acoustic property of a joint. An electrical event may be an increase in electrical resistance above a certain threshold value which lasts for at least a threshold time period. Because large resistances correspond to small electrical currents, events are also detected when an electrical current is below a certain threshold value for a particular applied voltage. In one embodiment of the present invention, the electrical current is supplied by a current source and monitored by an electric current meter. Then, when the voltage across the joint is measured, the electrical resistance of the joint can be compared to a preset threshold resistance. If the measured resistance exceeds the preset threshold for a preset threshold time period, an event will have occurred. Unit 140 may alternatively include an electrical current source and meter or an electrical voltage source and meter. It should be clear to a person of ordinary skill in the art that the electrical currents and voltages used in accordance with this invention may be DC or AC, including RF.

The threshold resistance may be any value, but can certainly be measured for values between about 10 kmilliohms and 10 megaohms with conventional resistance meters. The threshold time period may also be any period of time, but usually between about 1 nanosecond and about 10 milliseconds. These threshold values may be chosen based on the particular temperatures and applied forces used during a simulation.

One electrical monitoring unit that may be used in accordance with the present invention is a programmable event detector, available from Analysis Tech, of Wakefield, Mass. These event detectors are designed for monitoring passive electrical interconnects for short duration resistance changes during accelerated aging or stress testing.

In order to monitor events at electrically conducting joints, an electrical circuit must be established through those joints through which electrical current can flow during normal operation. One type of device that may be mounted to a circuit board via electrically conducting joints is a coaxial connector. A coaxial connector is for electrically connecting coaxial cables to the circuit board. These cables normally have an inner axial conductor that carries a signal surrounded by an outer braided shielding that during operation is usually connected to ground. A coaxial connector, therefore, has at least two electrically conducting joints providing electrical connections: a center pin joint and a shield joint. In order to increase mechanical and electrical reliability, the number of shield joints is often greater than one.

There are many ways to establish an electrical path through these joints for monitoring events. For example, as shown in FIG. 5, connecting device 505 has one center pin joint 515 and two shield joints 516 and 517. Conductive lines 518 and 519, which may be mounted to board 520, provide respective electrically conductive paths to shield joints 516 and 517. A ground plane (not shown) is located beneath the board surface and provides a ground connection to center pin joint 515. In addition, a conventional shorting cap (not shown) may be used to connect shield joints 516 and 517 to central pin joint 515.

Once these electrical connections are made, at least two different electrical tests can be performed on electrically conducting joints 515–517. A first test for monitoring events involves measuring the electrical resistance between electrically conducting pad 521 and ground via joints 515 and 516. In a similar fashion, a second test involves measuring the electrical resistance between electrically conducting pad 522 and ground via joints 515 and 517. In both tests, the electrical path extends between electrically conducting pad 521 or 522 and the ground plane via central pin 515. Therefore, in either test, an event will be detected if either a shield joint and/or the central pin joint fails.

These tests can be used in combination to provide information as to which joint failed. For example, if both tests are performed and only one event detected, the central pin joint is not at fault because that pin is common to both tests (unless the center pin joint failure is intermittent). When one event is detected, failure must be caused by one of the shield joints. If, however, events are detected in both tests, the identification of the failed joint be indeterminate. To determine which joint failed, a manual test may be performed that includes measuring the resistance across individual joints 516 and 517. Manual testing is problematic, however, because such testing may be time-consuming and cumbersome in an environmental chamber, especially at elevated or depressed temperatures.

One solution to this problem involves performing a third test using the electrical connections already made to perform the first two tests. The electrical circuit in this case is between shield joints 516 and 517 and does not pass through center pin joint 515 to the ground plane. When the third test does not detect an event, the failed joint is not shield joints 516 and 517, but most likely central pin joint 515.

When a connecter has more than two shield joints, such as shield joints 532–535 of connecting device 530 shown in FIG. 5, the electrical connections and tests used to identify failed joints are similar to the ones already described. With regard to the electrical connections, central pin joint 531 may be connected to ground via a ground plane. Also, each of conductive lines 536–538 may be attached to at least one shield joint 531–535. While it is preferable to connect each shield joint to a single conductive line, equipment limitations may require that more than one joint share a single conductive line (such as insufficient monitoring channels). This situation is shown in FIG. 5, where joints 532 and 533 are both electrically connected to conductive line 536. Other electrically conducting joints 534 and 535 are electrically connected to a respective conductive line 537 and 538. When two joints share a single conductive line, it is not possible to identify the specific joint responsible for the event. In order to make this identification, a manual test may be required.

When a plurality of devices are electrically monitored, information related to the events are preferably stored in memory unit 140 in an event profile. This information describes the state and history of the tested joints, including information such as the frequency of events, the temperatures of the joints before and during the events, the forces applied to the joints before and during the events, and the durations of the events. Such information may reveal a temperature or applied force dependence, which could be used to characterize the device or method of its attachment. This information may also reveal force thresholds at which electrical or mechanical failure begin. Once such thresholds are determined, they may be used to quantitatively compare different device and attachment methods.

Once an event profile is stored in memory unit 150, processing unit 160 may be programmed to characterize the tested electrically conducting joints by comparing the event profile with one or more predetermined event profiles that have known attachment reliabilities. The predetermined event profiles may be stored in memory unit 150 or in a separate memory unit (not shown). Such comparison allows processing unit 160 to determine useful quantities, such as an expected device lifetimes, which are commonly used by engineers to determine their attachment reliability. These comparisons may also be performed by any other programmable unit capable of performing statistical analysis of stored profiles.

Processing unit 160 may also be programmed to control the temperature inside environmental chamber 110 and the type of force (e.g, magnitude, direction, duration, etc.) applied by actuator 130 to device 105. In this way, processing unit 160 could cause actuator 130 to apply a desired force to device 105 at any temperature. For example, a desired force may include one or more separate or continuous forces applied before, during, or after cycling of the environmental conditions.

In order to further improve the attachment reliability test of the present invention, apparatus 100 may further include a conductive line with a resistor connected to ground. For example, as shown in FIG. 5, conductive line 550 has resistor 552 connected to ground. Line 550 acts as an antenna and detects transient noise events coincident with events at joints. A noise event is detected when a voltage (or an equivalent) is measured across resistor 552, which occurs when stray electromagnetic noise induces an electric current in line 550. Conductive line 550 is preferably on circuit board 520 to ensure that the joints and the conductive line are subject to the same electromagnetic noise. By comparing the incidence of noise events on line 550 with the incidence of events at the joints, spurious events can be recognized and removed from an event profile.

Figure 6:
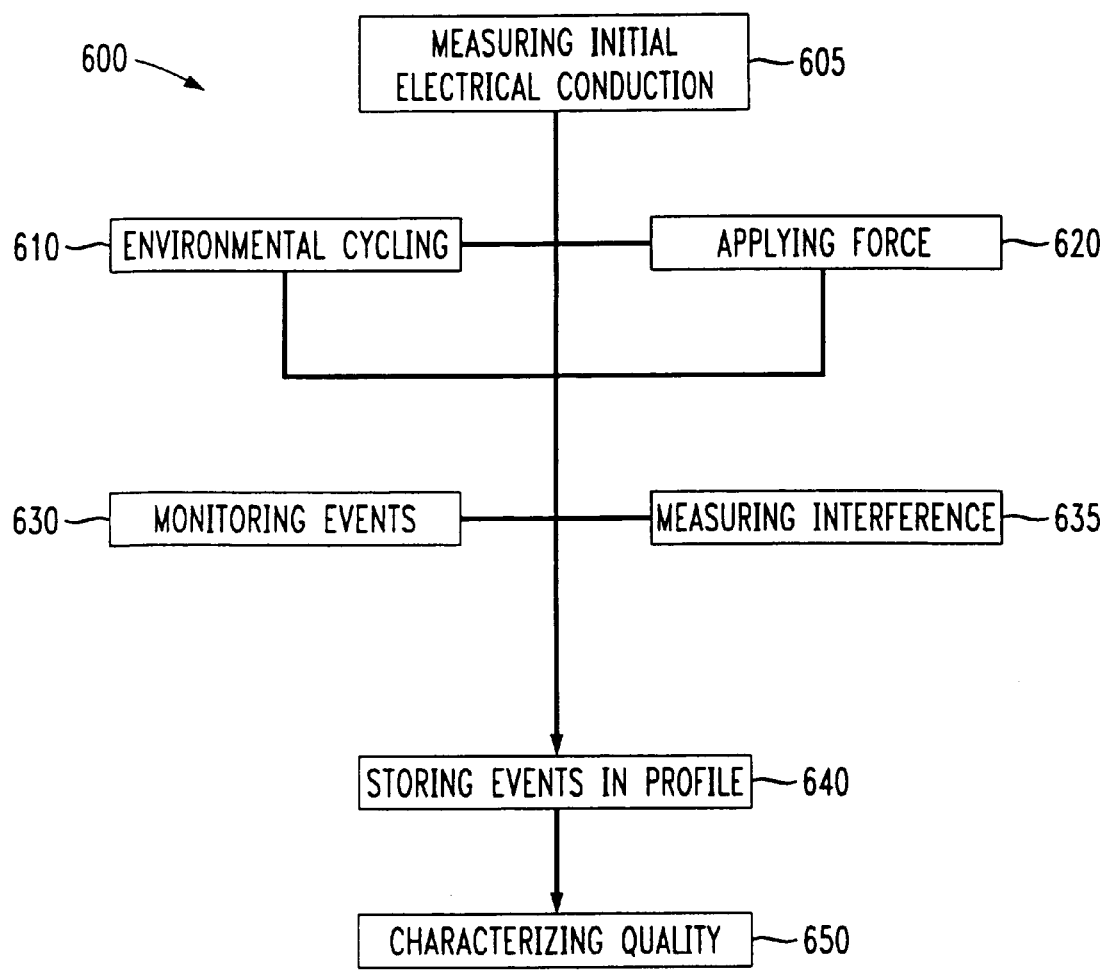
FIG. 6 is a flow chart of steps for carrying out an illustrative embodiment of the method for testing the electrical and mechanical reliability of at least one device mounted to a circuit board according to this invention.

FIG. 6 shows an illustrative sequence of steps in accordance with this invention for testing the electrical and mechanical reliability of a device mounted by an electrically conducting joint to a surface of a circuit board using apparatus 100 of FIG. 1. To some extent these steps have already been mentioned, so the discussion of them here may be somewhat abbreviated.

The method includes at least five steps 610, 620, 630, 640, and 650. In first step 610, a device (including its electrically conducting joints) is environmentally cycled. In second step 620, a force is applied to the device. In third step 630, events at the electrically conducting joints are monitored. In fourth step 640, information related to the events is stored in an event profile. And, in step 650, the quality of the joints are characterized by analyzing the stored event profile. The order of the steps is not critical. For example, steps 610, 620, and 630 may be performed simultaneously or alternately and repeatedly. Also, step 630 may be performed continuously throughout the testing procedure.

At the beginning of method 600, or at any other time during this method, environmental cycling, in step 610, includes varying the environmental conditions of the board (including the device and its electrically conducting joints) to a temperature that is greater or less than room temperature. A single environmental cycle may therefore include raising the temperature, lowering the temperature, or varying other environmental conditions such as humidity or exposure to harmful electromagnetic radiation, such as ultraviolet radiation. When trying to simulate accelerated environmental wear and tear, environmental cycling may be performed repeatedly. The joints being monitored may be continuously or periodically monitored during the environmental (e.g., thermal) cycles.

In step 620, a force is applied before, during, or after the board is environmentally cycled in stop 610. If the actuator is pneumatic, for example, the magnitude of the force may be precisely adjusted by varying the pneumatic pressure supplied to the actuator. The applied force may cause the device to rock on the surface of the board so that compression and tension forces may be alternately applied to any of the electrically conducting joints that mechanically support the connecter. Depending on the type of simulation desired, the force may be applied to the device along a direction that is substantially parallel or perpendicular to the board. A force may also be applied to the device in other directions by orienting the actuator appropriately.

As described earlier, devices mounted to a circuit board may be individually pushed or pulled by an actuator according to this invention. The ability to apply a force to an individual device provides a more accurate simulation than a conventional board flexing technique, in which the board is flexed out from its planar shape. The accuracy is further improved when a processing unit is programmed to apply a variable force, or a sequence of forces, over a period of time. The force may be applied to a device at any temperature provided by the environmental chamber. The force may also be applied continuously or non-continuously, depending on the type of simulation desired.

The magnitude of the applied force in step 620 is only limited by the mechanical limit of the actuator and the strength of the device. Generally, forces of up to about 50% of the shear force required to detach the device from the board. For example, many three and four pad RF-type connectors have been subject to applied forces having magnitudes of between about 5 pounds and about 20 pounds.

When two or more joints are electrically connected and monitored in series so that the joints have a total electrical resistance, monitoring in step 630 may include logging an event when the total resistance is greater than a threshold electrical resistance for a threshold time period. As described above, the threshold electrical resistance may be between about 10 milliohms and 10 megaohms and the threshold time period between about 1 nanosecond and about 10 milliseconds. A typical electrical resistance threshold according to this invention is several hundred to several thousand ohms, such as about 1,000 ohms. A time period threshold about 200 nanoseconds has been found useful when a resistance threshold of about 1,000 ohms is used.

When a device has a center pin joint and at least one shield joint, monitoring in step 630 may involve electrically connecting the center pin joint and the shield joint and monitoring the total electrical resistance. The step of electrically connecting the joints may be accomplished by the use of a shorting cap. Such a cap electrically connects the center pin with the cable's shield. When a device has a center pin joint and at least two shield joints, the monitoring stop may include monitoring the electrical resistance of both joints. In this case, no shorting cap is necessary because the shield joints are connected through the device itself.

Information relating to events are stored in at least one event profile in a memory unit. The profile may be later used to characterize the attachment reliability, such as the expected lifetime, of the device's joints by comparing them with certain predetermined event profiles that have known attachment reliabilities.

As described above, the method of testing a device in accordance with the principles of this invention may further include measuring the initial electrical condition, such as the electrical resistance, of an electrically conducting joint, in step 605, before being electrically monitored, in step 630. This provides a background against which future events can be compared.

In addition to measuring the initial condition of a joint, method 600 may include measuring interference noise in step 635 during monitoring step 630. As described above, when interference noise and events are detected at the same time, spurious events can be identified and removed from the event profile before being used to characterize the joints of the device. Step 635 is preferably performed with a conductive line and resistor connected to ground (as shown in FIG. 5). The line acts as an antenna and detects transient noise events that are coincident with events detected at the joint.

The foregoing is merely illustrative of the principles of this invention and various modifications can be made by those skilled in the art without departing from the scope and spirit of the invention.

What is claimed is:

1. An apparatus for testing the attachment reliability of a plurality of devices, wherein each of said plurality of devices is mounted by at least an electrically conducting joint to a surface of a circuit board, said apparatus comprising:

an environmental chamber in which said board can be placed;

an actuator capable of applying a controlled force to a first of said plurality of devices without physically disturbing any other of said plurality of devices;

an electrical monitoring unit for monitoring electrical events at said electrically conducting joint; and a memory unit for storing an event profile that includes information related to said electrical events.

2. The apparatus of claim 1 wherein said environmental chamber provides variable environmental conditions.

3. The apparatus of claim 2 wherein said environmental chamber provides a variable temperature that is synchronized with said monitoring unit.

4. The apparatus of claim 1 wherein said actuator comprises a hydraulically operated piston.

5. The apparatus of claim 1 wherein said actuator comprises a pneumatically operated piston.

6. The apparatus of claim 1 wherein said actuator can push and pull said first device.

7. The apparatus of claim 6 wherein said actuator includes a tip portion for fastening said actuator to said first device.

8. The apparatus of claim 7 wherein said tip portion has a shape which is adapted to receive said first device.

9. The apparatus of claim 1 further comprising a processing unit for characterizing the quality of said electrically conducting joint based on said stored event profile.

10. The apparatus of claim 9 wherein said actuator is for applying a force to said first device, said force having a magnitude, said magnitude being controlled by said processing unit.

11. The apparatus of claim 10 wherein said processing unit is programmed to cause said actuator to apply a force to said first device in a synchronized fashion with an environmental cycle provided by said environmental chamber.

12. The apparatus of claim 11 wherein said processing unit is programmed to cause said actuator to apply a force to said device in a synchronized fashion with a thermal cycle provided by said environmental chamber.

13. The apparatus of claim 10 wherein said processing unit is programmed to cause said actuator to apply said force before, after, or during said environmental cycle.

14. The apparatus of claim 1 wherein said actuator is mounted to said board adjacent said first device.

15. The apparatus of claim 1 wherein said actuator is mounted separately from said board for facilitating board exchange.

16. The apparatus of claim 1 wherein said electrical monitoring apparatus comprises:
an electrical current source for applying an electrical current through said joint; and
an electrical current meter for monitoring said electrical current through said joint, wherein said electrical events are logged when said electrical current is less than a threshold current for a threshold time period, said threshold current corresponding to a threshold resistance.

17. The apparatus of claim 16 wherein said threshold electrical resistance is between about 10 milliohms and 10 megaohms.

18. The apparatus of claim 16 wherein said threshold time period is between about 1 nanosecond and about 10 milliseconds.

19. The apparatus of claim 1 wherein said monitoring apparatus comprises:
an electrical voltage source for applying a voltage across said joint; and
an electrical current meter for monitoring an electrical current through said joint, wherein said electrical events are logged when said electrical current is less than a threshold current for a threshold time period, said threshold current corresponding to a threshold resistance.

20. The apparatus of claim 19 wherein said threshold electrical resistance is between about 10 milliohms and about 10 megaohms.

21. The apparatus of claim 19 wherein said threshold time period is between about 1 nanosecond and about 10 milliseconds.

22. The apparatus of claim 1 wherein said at least one joint includes a center pin joint and at least one shield joint, said apparatus further comprising a shorting cap for electrically shorting said center pin joint and one or more of said at least one shield joints.

23. The apparatus of claim 1 wherein said memory unit is for storing information related to said events in an event profile.

24. The apparatus of claim 23 wherein said event profile comprises information selected from group consisting of frequency, temperature, force, and duration information that relate to said events.

25. The apparatus of claim 9 wherein said processing unit is programmed to control both a temperature in said environmental chamber and said force applied by said actuator to said first device.

26. The apparatus of claim 9 wherein said processing unit is programmed to generate said event profile for comparison with predetermined event profiles that have known attachment reliability.

27. The apparatus of claim 1 further comprising a conductive line acting as an antenna mounted on said board with a resistor connected to ground for detecting a voltage across said resistor when a transient noise event is coincident with at least one of said electrical events detected at said joint.

28. A method for testing the electrical and mechanical reliability of a plurality of devices, wherein each of said plurality of devices is mounted by at least one electrically conducting joint to a surface of a circuit board, said method comprising:
environmentally cycling a first of said plurality of devices and said at least one electrically conducting joint;
applying a controlled force to said first device without physically disturbing any other of said plurality of devices;
monitoring for any electrical events at said electrically conducting joint;
storing information related to said electrical events in an event profile; and
characterizing the quality of said joint based on said stored event profile.

29. The method of claim 28 wherein said joint is at a set of environmental conditions, said environmentally cycling comprises varying at least one of said conditions so that it is different from an ambient condition.

30. The method of claim 29 wherein one of said conditions is temperature, said environmental cycling comprises varying said temperature to a temperature that is different from ambient temperature.

31. The method of claim 28 wherein said environmental cycling is performed repeatedly during said monitoring.

32. The method of claim 28 wherein said applying said force occurs before, after, or during said environmental cycling.

33. The method of claim 28 wherein said force has a magnitude and wherein said applying said force comprises precisely adjusting said magnitude by controlling a pneumatically operated piston.

34. The method of claim 28 wherein said applying said force comprises rocking said first device so that a compression force and a tension force are alternately applied to said joint.

35. The method of claim 28 wherein said applying said force comprises applying said force along a direction that is substantially parallel to said board.

36. The method of claim 31 wherein said applying said force comprises applying said force along a direction that is not substantially parallel to said board.

37. The method of claim 28 wherein said applying said force comprises applying said force with a magnitude of up to about 50% of a shear force required to detach said first device from said board.

38. The method of claim 37 wherein said applying said force comprises applying said force having a magnitude of between about 5 pounds and about 20 pounds.

39. The method of claim 37 wherein said applying said force comprises pulling said first device.

40. The method of claim 37 wherein said applying said force comprises pushing said first device.

41. The method of claim 28 wherein said applying said force is performed while said board is held in a substantially flat plane.

42. The method of claim 28 wherein said applying said force comprises applying a variable force over a period of time.

43. The method of claim 28 wherein said applying said force comprises applying said force in either a continuous or non-continuous manner.

44. The method of claim 28 wherein said joint has a total electrical resistance, and wherein said monitoring comprises logging at least one of said events when said total resistance is greater than a threshold electrical resistance for a threshold time period.

45. The method of claim 44 wherein said logging comprises logging when said threshold electrical resistance is between about 10 milliohms and 10 megaohms.

46. The method of claim 44 wherein said logging comprises logging when said threshold time period is between about 1 nanosecond and about 10 milliseconds.

47. The method of claim 28 wherein said at least one joint includes a center pin joint and at least one shield joint, and wherein said monitoring comprises:

electrically connecting said center pin joint and said shield joint in series; and monitoring a total electrical resistance of said joints.

48. The method of claim 47 wherein said electrically connecting comprises shorting said center pin and shield joints by placing a shorting cap on said first device.

49. The method of claim 28 wherein said at least one joint includes a center pin joint and at least two shield joints, and wherein said monitoring comprises monitoring a total electrical resistance of said shield joints.

50. The method of claim 28 wherein said storing comprises storing frequency, temperature, force, and duration information that relates to said electrical events.

51. The method of claim 28 further comprising measuring an initial resistance level before said monitoring to determine the initial electrical condition of said joint.

52. The method of claim 28 further comprising measuring interference noise during said monitoring for detecting spurious electrical events.

53. The method of claim 52 wherein said circuit board has a conductive line acting as an antenna with a resistor connected to ground, wherein said measuring comprises detecting a voltage across said resistor when a transient noise event is coincident with any of said electrical events detected at said joint.

* * * * *